(12) United States Patent
Johnson et al.

(10) Patent No.: US 7,599,457 B2
(45) Date of Patent: Oct. 6, 2009

(54) CLOCK-AND-DATA-RECOVERY SYSTEM HAVING A MULTI-PHASE CLOCK GENERATOR FOR ONE OR MORE CHANNEL CIRCUITS

(75) Inventors: Phillip Johnson, Allentown, PA (US); Zheng Chen, Macungie, PA (US); Barry Britton, Orefield, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 409 days.

(21) Appl. No.: 11/199,287

(22) Filed: Aug. 8, 2005

(65) Prior Publication Data
US 2007/0030936 A1 Feb. 8, 2007

(51) Int. Cl.
*H04L 7/02* (2006.01)
(52) U.S. Cl. .......... 375/359; 326/93; 365/233.1; 370/395.62; 370/518; 398/155
(58) Field of Classification Search .......... 375/354, 375/355, 359, 360, 362, 371, 373, 375, 364; 327/141, 158, 164, 165, 166, 167, 170, 176, 327/295; 711/167; 369/4
See application file for complete search history.

(56) References Cited

U.S. PATENT DOCUMENTS

| | | | | |
|---|---|---|---|---|
| 5,920,897 A * | 7/1999 | Jin et al. | | 711/167 |
| 6,215,737 B1 * | 4/2001 | Thagard et al. | | 369/4 |
| 6,266,799 B1 | 7/2001 | Lee et al. | | 716/6 |
| 6,292,116 B1 * | 9/2001 | Wang et al. | | 341/100 |
| 6,711,716 B1 * | 3/2004 | Mueller et al. | | 716/1 |
| 6,753,712 B2 * | 6/2004 | Saeki | | 327/165 |
| 6,856,661 B2 | 2/2005 | Cho | | 375/371 |
| 2002/0080899 A1 * | 6/2002 | Fyvie | | 375/364 |
| 2003/0188235 A1 * | 10/2003 | Kozaki | | 714/700 |
| 2004/0017243 A1 * | 1/2004 | Sasaki | | 327/295 |

OTHER PUBLICATIONS

"Data Recovery," by Nick Sawyer, Xilinx, XAPP224, v2.4, Jan. 24, 2005.

* cited by examiner

*Primary Examiner*—Mohammad H Ghayour
*Assistant Examiner*—Adolf Dsouza
(74) *Attorney, Agent, or Firm*—Mendelsohn, Drucker & Associates, P.C.

(57) ABSTRACT

In one embodiment of the invention, a clock-and-data-recovery (CDR) system has a multi-phase clock generator that generates a plurality of phase-offset clock signals and one or more channel circuits, each receiving a (different) input data signal and all of the phase-offset clock signals and generates an output data stream and a recovered clock signal. Each channel circuit has a plurality of data registers (e.g., flip-flops), each receiving the input data signal at its clock input port and a different one of the phase-offset clock signals at its data input port, such that the flip-flop is triggered at each (rising) edge in the input data signal. The channel circuit processes the outputs from the different flip-flops to select an appropriate phase-offset clock signal for use in sampling the input data signal to generate the output data stream, where the recovered clock signal is generated from the selected phase-offset clock signal.

11 Claims, 3 Drawing Sheets

US 7,599,457 B2

CLOCK-AND-DATA-RECOVERY SYSTEM HAVING A MULTI-PHASE CLOCK GENERATOR FOR ONE OR MORE CHANNEL CIRCUITS

TECHNICAL FIELD

The present invention relates to electronics, and, in particular, to clock-and-data-recovery circuits.

BACKGROUND

In non-clock-forwarded communications systems, data streams are transmitted to receivers without transmitting separate, distinct clock signals. In such systems, a receiver can perform clock-and-data-recovery (CDR) processing to recover a clock signal from each data stream, where the clock signal is derived based on the timing of the data represented in the data stream. A typical CDR circuit comprises a sampling clock generator, such as a phase-locked loop (PLL) or a delay-locked loop (DLL), that generates one or more sampling clocks used to sample the received data stream. In some communications systems, a single receiver may receive multiple, different data streams, potentially having different data rates. Such a receiver will typically have a different CDR circuit for each different data stream. Implementing multiple CDR circuits, each with its own sampling clock generator can require too much layout area and/or operating power for some integrated circuit applications.

SUMMARY

In one embodiment, the present invention is a clock-and-data recovery system, comprising a clock generator and one or more channel circuits. The clock generator generates a plurality of phase-offset clock signals, and each channel circuit generates an output data stream and a recovered clock signal based on an input data signal. Each channel circuit comprises a data for each phase-offset clock signal, a logic circuit, and a data sampler. Each data register generates an output signal based on the level of the corresponding phase-offset clock signal at a transition in the input data signal. The logic circuit processes the output signals from the data registers to select one of the phase-offset clock signals as a sampling clock signal, and the data sampler samples the input data signal based on the sampling clock signal to generate the output data stream and generates the recovered clock signal based on the sampling clock signal.

In another embodiment, the present invention is a clock-and-data recovery system, comprising a clock generator and two or more channel circuits coupled to the clock generator. The clock generator generates a plurality of phase-offset clock signals. Each channel circuit generates an output data stream and a recovered clock signal based on an input data signal and the plurality of phase-offset clock signals.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 1:
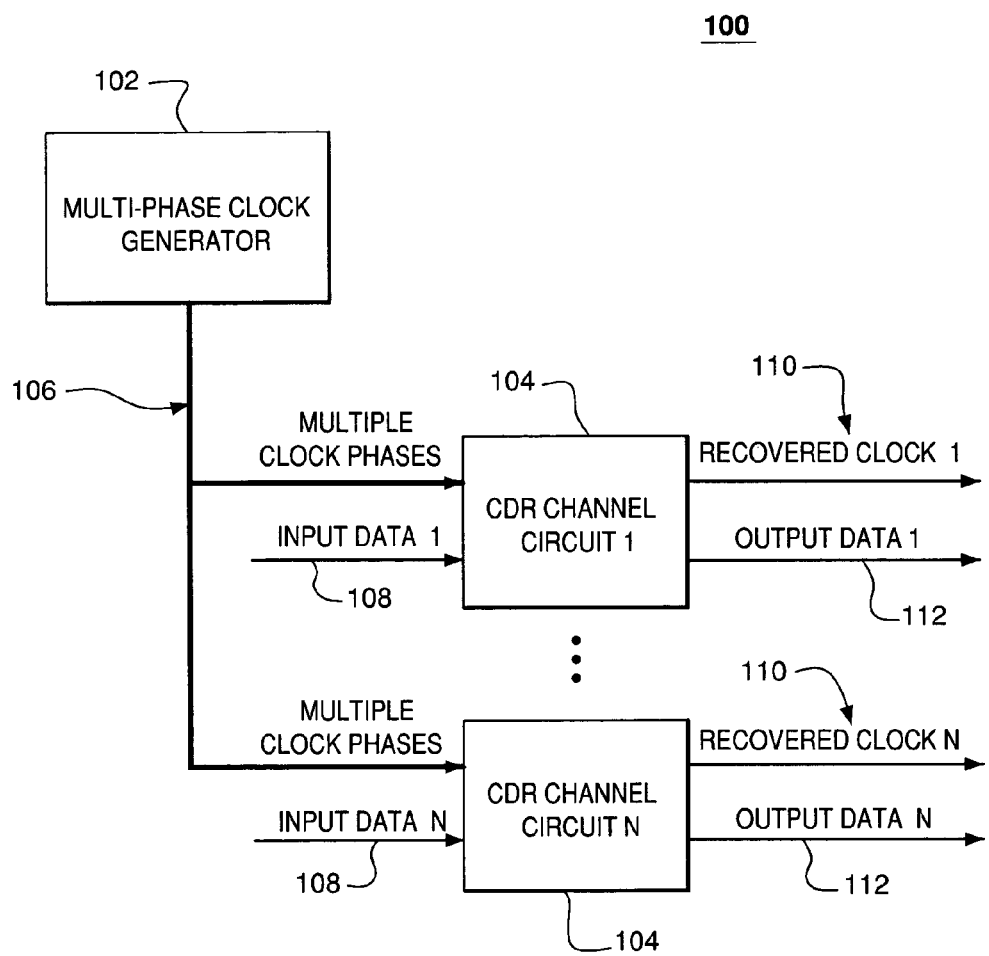
FIG. 1 is a block diagram of a clock-and-data-recovery system, according to one embodiment of the present invention.

FIG. 1 is a block diagram of a clock-and-data-recovery system 100, according to one embodiment of the present invention. CDR system 100 has a multi-phase clock generator 102 and N CDR channel circuits 104, where N≧1.

Clock generator 102 generates a multi-phase set of clock signals 106 (i.e., multiple versions of a clock signal sequentially separated from each other in phase over one clock period by a specified phase-offset increment). For example, in one implementation, clock generator 102 generates 16 clock signals, each having the same frequency, but separated in phase from the previous clock signal by about 22.5 degrees. Clock signals 106 are all applied to each CDR channel circuit 104, which uses the set of clock signals to generate a (different) recovered clock signal 110 and a (different) output data stream 112 from a corresponding (different) input data signal 108, potentially having different data rates.

Figure 2:
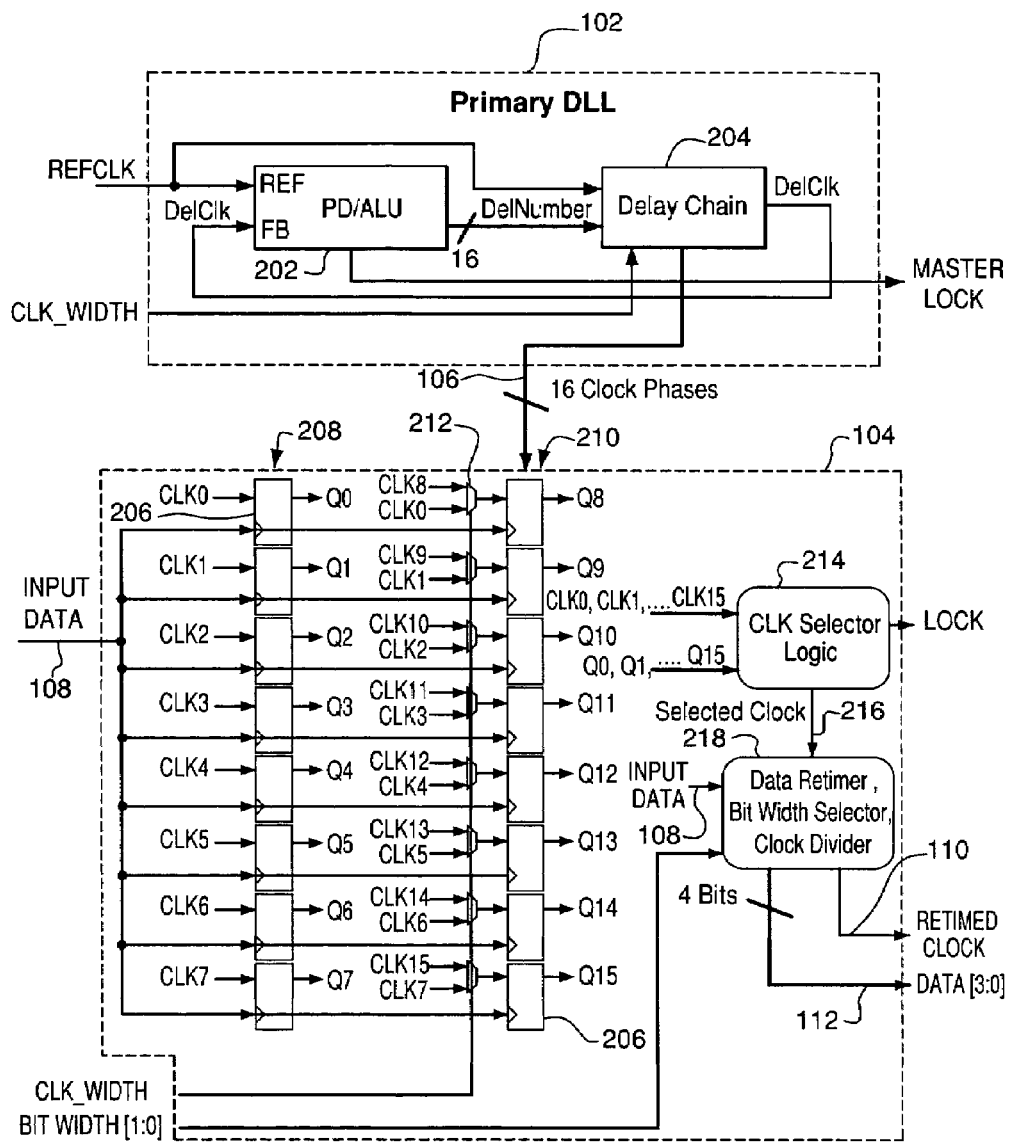
FIG. 2 is a more-detailed block diagram of one possible implementation of the CDR system of FIG. 1.

FIG. 2 is a more-detailed block diagram of one possible implementation of CDR system 100 of FIG. 1. Although FIG. 2 shows only one CDR channel circuit 104, the implementation may include other, similar CDR channel circuits.

In this particular implementation, multi-phase clock generator 102 is a delay-locked loop (DLL) that is capable of selectively generating either 16 clock signals (separated by phase-offset increments of about 22.5 degree) or 8 clock signals (separated by phase-offset increments of about 45 degrees). Clock generator 102 comprises a phase detector/arithmetic logic unit (PD/ALU) 202 and a delay chain 204 (i.e., a chain of series-connected delay elements (not shown)), where the value of 1-bit control signal CLK_WIDTH dictates whether clock generator 102 generates 16 clock signals (e.g., CLK_WIDTH=0) or 8 clock signals (e.g., CLK_WIDTH=1). A received reference clock (REFCLK) is applied to the first delay element in delay chain 204, where each delay element in the chain delays the reference clock by an incremental amount of time, which corresponds to a reasonably predictable amount of phase for a given clock rate. Each clock signal 106 corresponds to the output of (a different) one of the delay elements in delay chain 204, as selected using a corresponding multiplexer (not shown) in delay chain 204. In one embodiment, the number of delay elements in delay chain 204 and the number of clock signals output from delay chain 204 are metal mask programmable.

In addition to the reference clock, delay chain 204 receives, from PD/ALU 202, 16 DelNumber values, each of which dictates the number of delay elements in delay chain 204 between a different pair of successive clock signals 106. Assume, for example, that reference clock REFCLK has a period of 100 nsec, that each delay element in delay chain 204 delays the reference clock by 1 nsec (i.e., corresponding to a phase shift of about 3.6 degrees), and that clock generator 102 is configured to generate 16 clock signals. In that case, the 16 DelNumber values may be (6, 6, 7, 6, 6, 6, 7, 6, 6, 6, 7, 6, 6, 6, 7, 6), where the first of the 16 clock signals 106 is selected to be the output from the 6$^{th}$ delay element in delay chain 204, where that first clock signal corresponds to reference clock REFCLK delayed by 6 nsec, where (6/100)*360 degrees=21.6 degrees (which is as close to the desired 22.5 degrees as can be achieved by delay chain 204). The second clock signal 106 would be selected to be the output from the 12$^{th}$ (i.e., 6+6) delay element in delay chain 204, where that second clock signal corresponds to reference clock REFCLK delayed by 12 nsec, where (12/100)*360 degrees=43.2 degrees (which is as close to the desired 45 degrees as can be achieved by delay chain 204). The third clock signal 106 would be selected to be the output from the 19$^{th}$ (i.e., 12+7) delay element in delay chain 204, where that third clock signal corresponds to reference clock REFCLK delayed by 19 nsec, where (19/100)*360 degrees=68.4 degrees (which is as close to the desired 67.5 degrees as can be achieved by delay chain 204). And so on, for the remaining 13 clock signals 106. Note that the sixteen clock signal 106 would be selected to be the output from the 100$^{th}$ (i.e., 6+6+7+6+6+6+7+6+6+6+7+6+6+6+7+6) delay element in delay chain 204, where that sixteenth clock signal corresponds to reference clock REFCLK delayed by 100 nsec (i.e., one complete 360-degree clock cycle of REFCLK). Note further that, when clock generator 102 is configured to generate 8, instead of 16, clock signals, the 8 clock signals 106 could be generated using (12, 13, 12, 13, 12, 13, 12, 13) as the 8 DelNumber values, where the eighth clock signal would correspond to reference clock REFCLK delayed by one complete clock cycle. The values used in these examples are for purposes of explanation only; actual values may be larger or smaller.

The last selected clock (i.e., either the sixteenth clock signal or the eighth clock signal, depending on whether clock generator 102 is configured to generate 16 or 8 clock signals) is fed back from delay chain 204 as feedback clock signal DelClk to PD/ALU 202, which also receives reference clock REFCLK. PD/ALU 202 generates the phase difference between REFCLK and DelClk and uses that phase difference to adjust the DelNumber values as necessary to ensure that those two clock signals are as close to being in phase (i.e., separated by one complete clock cycle of REFCLK) as possible. When those clock signals are in phase (e.g., to within a specified threshold), PD/ALU 202 sets the 1-bit status signal MASTER LOCK to a value (e.g., 1) that indicates that clock signals 106 are valid.

As shown in FIG. 2, CDR channel circuit 104 receives input data signal 108 and (up to) 16 clock signals 106, referred to as CLK0-CLK15. CDR channel circuit 104 has 16 data registers 206 (e.g., flip-flops, although other types of data registers are possible) arranged in two banks 208 and 210, where input data signal 108 is applied to the clock input of each flip-flop. In bank 208, each of the first eight clock signals CLK0-CLK7 is applied to the data input of a different flip-flop.

In addition to eight flip-flops, bank 210 also has a (2×1) multiplexer (mux) 212 for each flip-flop, where one of the second eight clock signals CLK8-CLK15 is applied to the "0" input of each mux 212 and a corresponding one of the first eight clock signals CLK0-CLK7 is applied to the mux's "1" input. The output of each mux 212 is applied to the data input of the corresponding flip-flop 206, where the selection of which received clock signal to apply is dictated by control signal CLK_WIDTH. In particular, if CLK_WIDTH=0, then CDR system 100 is configured in its 16-phase mode, and muxes 212 apply the second eight clock signals CLK8-CLK15 to flip-flops 206 of bank 210. If CLK_WIDTH=1, then CDR system 100 is configured in its 8-phase mode, and muxes 212 apply the first eight clock signals CLK0-CLK7 to flip-flops 206 of bank 210. Note that, in this latter configuration, both the first flip-flop (in bank 208) and the eighth flip-flop (in bank 210) receive clock signal CLK0, and analogously for clock signals CLK1-CLK7 and the other seven pairs of flip-flops in banks 208 and 210.

As just described, when CDR system 100 is configured in its 16-phase mode, a different one of the 16 clock signals CLK0-CLK15 is applied to the data input of a different one of the 16 flip-flops 206, while input data signal 108 is applied to the clock input of each flip-flop. Assuming, for example, that flip-flops 206 are triggered by rising edges (in alternative implementations, falling-edge-triggered flip-flops could be used), when a rising edge occurs in input data signal 108 (e.g., corresponding to a data transition from a "0" to a "1"), each flip-flop will (substantially) simultaneously present the current value of its received clock signal CLKi as its output value Qi.

In general, when reference clock REFCLK (and each clock signal 106) has a 50% duty cycle, at any given instant (other than those instants corresponding to clock transitions), the values of half of clock signals 106 will be high, and the values of the rest will be low. Moreover, since clock signals CLK0-CLK15 represent a sequence of increasingly phase-offset clock signals, eight consecutive clock signals 106 will be either high or low and the rest will be the opposite.

Figure 3:
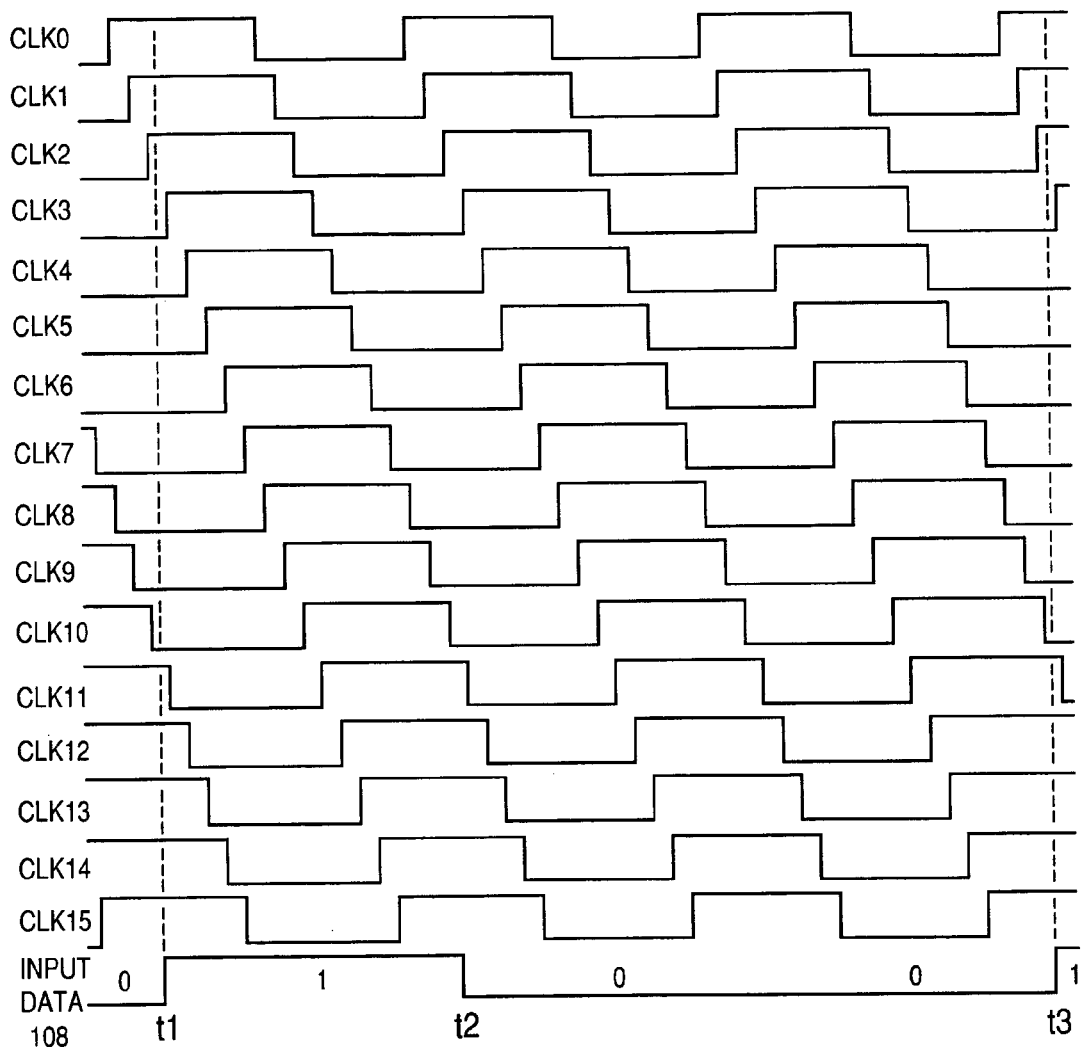
FIG. 3 shows an exemplary timing diagram illustrating the relationship between the input data signal and the sixteen clock signals of FIG. 2.

FIG. 3 shows an exemplary timing diagram illustrating the relationship between input data signal 108 and the sixteen clock signals CLK0-CLK15. The portion of input data signal 108 shown in FIG. 3 corresponds to a bit sequence of (0 1 0 0 1) and has rising transitions at times t1 and t3 and a falling transition at time t2. At time t1, for example, clocks CLK0-CLK2 and CLK11-CLK15 are high and eight consecutive clocks CLK3-CLK10 are low. Since the transition at time t1 is a rising edge, at time t1, all 16 flip-flops will be triggered, the values of flip-flop outputs Q0-Q2 and Q11-Q15 will be high, and the values of flip-flop outputs Q3-Q10 will be low. The same will be true at time t3. Note that, since the transition at time t2 is a falling transition, the rising-edge-triggered flip-flops will not be triggered, and the Q values will not be updated.

Referring again to FIG. 2, the sixteen flip-flop output values Q1-Q15 are applied to clock selector logic 214 along with the sixteen clock signals CLK0-CLK15. Clock selector logic 214 analyzes the 16 Qi values to select one of clock signals CLKi as selected clock 216 for input to processing block 218. In particular, clock selector logic 214 looks for transitions in the Q values received from the flip-flops and selects one of the clock signals CLKi based clock signals corresponding to that transition. For example, clock selector logic 214 could look for the first Q-value transition and then, depending on whether the transition was from Q=0 to Q=1 or from Q=1 to Q=0, select an appropriate clock signal. For example, in the example of FIG. 3, the first Q-value transition occurs between CLK2 to CLK3. Since that transition is a 1-to-0 transition, clock selector logic 214 selects a clock 180 degrees away (e.g., CLK11) for use as selected clock 216. If the transition were a 0-to-1 transition, then clock selector logic 214 would select one of the clocks corresponding to the transition, rather than looking 180 degrees away.

In addition to selected clock 216, processing block 218 receives input data signal 108 and control signal BIT_WIDTH. In one implementation, processing block 218 samples input data signal 108 at every rising edge of selected clock 216 to generate sampled data. In this particular embodiment, processing block 218 is capable of outputting the sampled data as a serial or parallel data stream, where the parallelism of output data stream 112 is controlled by the value of control signal BIT_WIDTH, such that output data stream 112 can be up to 4 bits wide. In addition, processing block 218 has a clock divider that divides selected clock 216 by the same value dictated by the BIT_WIDTH control signal to generate recovered clock signal 110 as a divided version of selected clock 216. By parallelizing the output data and dividing the selected clock signal, downstream digital logic (e.g., used to decode the output data) is able to run at a lower frequency. A first-in, first-out (FIFO) buffer can be used to re-time the data to make chip routing less of an issue.

When CDR system 100 of FIG. 2 is configured in its 8-phase mode, only eight different clock signals CLK0-CLK7 are generated by clock generator 102 and input to each CDR channel circuit 104. In this case, muxes 212 are controlled by CLK_WIDTH to select the "1" inputs for application to the data inputs of the flip-flops in bank 210. In that case, Q0 and Q8 provide substantially redundant information, which clock selector logic 214 can use to increase the reliability of its processing. In an alternative embodiment, muxes 212 are omitted and the flip-flop outputs Qi of bank 210 are ignored by clock selector logic 214 if CDR system 100 is configured in its 8-phase mode (i.e., CLK_WIDTH=1).

Since the 8-phase mode uses only eight muxes in delay chain 204, CDR channel circuit 104 can operate at a higher frequency than during the 16-phase mode. In general, when clock generator 102 is implemented as a DLL, as in FIG. 2, the maximum frequency of the clock generator is a function of the number of phases and the intrinsic delay of each delay element. For example, if each delay element has a minimum delay of 1 ns, then the maximum frequency of clock generator 102 for the 16-phase mode would be 1/(16 ns) or about 62.5 MHz. For the 8-phase mode, however, the maximum frequency of the clock generator would be 1/(8 ns) or about 125 MHz.

In the exemplary timing diagram of FIG. 3, the frequency of input data signal 108 is the same as the frequencies of clock signals CLK0-CLK15. In general, that need not be true. As a result, clock selector logic 214 may need to constantly change which clock signal is used for selected clock 216.

In some implementations, there are limits placed on which clock signals can be selected by clock selector logic 214. For example, in one possible implementation, at each cycle of the control loop, clock selector logic 214 can change the selected clock by at most one clock signal in either direction from the previously selected clock signal. If the desired change is greater than the specified limit, then the control loop is not correctly locked to the data, and lock signal LOCK is set low by clock selector logic 214.

Although the present invention has been described in the context of a CDR system in which a multi-phase DLL is used to generate the phase-offset clock signals, in other embodiments, other types of multi-phase clock generators can be used, including multi-phase voltage-controlled oscillators (VCOs). Furthermore, although the present invention has been described in the context of a CDR system capable of generating either 8 or 16 different clock signals, other embodiments may generate other numbers of phase-offset clock signals, including only one number of clock signals or more than two different numbers of clock signals.

While the exemplary embodiments of the present invention have been described with respect to processes of circuits, including possible implementation as a single integrated circuit, a multi chip module, a single card, or a multi card circuit pack, the present invention is not so limited. As would be apparent to one skilled in the art, various functions of circuit elements may also be implemented as processing blocks in a software program. Such software may be employed in, for example, a digital signal processor, micro controller, or general purpose computer.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

We claim:

1. A clock-and-data recovery (CDR) system, comprising:
a clock generator adapted to generate a plurality of phase-offset clock signals; and
one or more channel circuits, each channel circuit adapted to generate an output data stream and a recovered clock signal based on an input data signal, wherein each channel circuit comprises:
a data register for each phase-offset clock signal, the data register adapted to generate an output signal based on the level of the corresponding phase-offset clock signal at a transition in the input data signal;
a logic circuit adapted to process the output signals from the data registers to select one of the phase-offset clock signals as a sampling clock signal; and
a data sampler adapted to sample the input data signal based on the sampling clock signal to generate the output data stream and generate the recovered clock signal based on the sampling clock signal, wherein:
each channel circuit comprises first and second banks of data registers;
the CDR system is adapted to be selectively configured to operate in one of a first mode and a second mode;
in the first mode, the CDR system is selectively configured such that:
the clock generator generates a first set of phase-offset clock signals;
the first set of phase-offset clock signals is applied to both the first and second banks of data registers; and
the logic circuit selects a data register output signal corresponding to a phase-offset clock signal of the first set of phase-offset clock signals as the sampling clock signal; and
in the second mode, the CDR system is selectively configured such that:
the clock generator generates the first set of phase-offset clock signals and a second set of phase-offset clock signals;
the first set of phase-offset clock signals is applied to the first bank of data registers;
the second set of phase-offset clock signals is applied to the second bank of data registers; and
the logic circuit selects a data register output signal corresponding to a phase-offset clock signal of the first and second sets of phase-offset clock signals as the sampling clock signal.

2. The clock-and-data recovery system of claim 1, further comprising a clock divider adapted to divide the sampling clock signal by a specified divisor value to generate the recovered clock signal.

3. The clock-and-data recovery system of claim 2, wherein the data sampler is adapted to generate the output data stream as a parallelized data stream.

4. The clock-and-data recovery system of claim 1, wherein:
each data register is an edge-triggered flip-flop, having a data input port, a clock input port, and a data output port;

each flip-flop is connected to receive the corresponding phase-offset clock signal at its data input port and the input data signal at its clock input port; and each flip-flop is adapted to present values of the phase-offset clock signal at its data output port at certain transitions in the input data signal.

5. The clock-and-data recovery system of claim 4, wherein the flip-flops are triggered by rising edges in the input data signal.

6. The clock-and-data recovery system of claim 1, wherein the clock generator is a delay-locked loop (DLL).

7. The clock-and-data recovery system of claim 6, wherein:

the DLL comprises a phase detector and a delay chain;

the plurality of phase-offset clock signals are output from different selected delay elements along the delay chain; and the phase detector is adapted to control the selection of the different delay elements based on a phase difference between a received reference clock and one of the phase-offset clock signals.

8. The clock-and-data recovery system of claim 7, wherein the number of delay elements in the delay chain and the number of phase-offset clock signals output from the delay chain are metal mask programmable.

9. The invention of claim 1, wherein the CDR system further comprises a multiplexer for each data register in the second bank of data registers, wherein:

the multiplexer is connected to receive a phase-offset clock signal of the first set and a corresponding phase-offset clock signal of a second set; and the multiplexer is adapted to provide one of the received phase-offset clock signals to the corresponding data register in the second bank of data registers depending on whether the CDR system is configured to operate in the first mode or the second mode.

10. The clock-and-data recovery system of claim 1, comprising two or more of the channel circuits.

11. The clock-and-data recovery system of claim 10, wherein the input data signals associated with at least two of the channel circuits have different data rates.

* * * * *

UNITED STATES PATENT AND TRADEMARK OFFICE
CERTIFICATE OF CORRECTION

PATENT NO. : 7,599,457 B2 Page 1 of 1
APPLICATION NO. : 11/199287
DATED : October 6, 2009
INVENTOR(S) : Johnson et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 783 days.

Signed and Sealed this

Twenty-eighth Day of September, 2010

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,599,457 B2 | |
| APPLICATION NO. | : 11/199287 | |
| DATED | : October 6, 2009 | |
| INVENTOR(S) | : Phillip Johnson, Zheng Chen and Barry Britton | |

It is certified that error appears in the above-identified patent and that said Letters Patent is hereby corrected as shown below:

Column 8, line 5, change "The invention of" to --The clock-and-data-recovery system of--.

Signed and Sealed this
Seventeenth Day of January, 2012

David J. Kappos
*Director of the United States Patent and Trademark Office*